US007925937B2

(12) United States Patent
Irby et al.

(10) Patent No.: US 7,925,937 B2
(45) Date of Patent: Apr. 12, 2011

(54) APPARATUS FOR TESTING EMBEDDED MEMORY READ PATHS

(75) Inventors: Joel T. Irby, Austin, TX (US); Grady L. Giles, Dripping Springs, TX (US); Alexander W. Schaefer, Austin, TX (US); Gregory A. Constant, Austin, TX (US); Floyd L. Dankert, Austin, TX (US); Amy M. Novak, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 584 days.

(21) Appl. No.: 11/970,018

(22) Filed: Jan. 7, 2008

(65) Prior Publication Data

US 2009/0177934 A1    Jul. 9, 2009

(51) Int. Cl.
G11C 29/00 (2006.01)
G01R 31/28 (2006.01)

(52) U.S. Cl. .................................. 714/718; 714/726
(58) Field of Classification Search .................. 714/718, 714/724, 726, 731
See application file for complete search history.

(56) References Cited

U.S. PATENT DOCUMENTS

| | | | | |
|---|---|---|---|---|
| 4,074,851 A | * | 2/1978 | Eichelberger et al. | 714/726 |
| 5,331,643 A | * | 7/1994 | Smith | 714/728 |
| 6,587,996 B1 | | 7/2003 | Reohr, Jr. et al. | |
| 7,102,915 B2 | * | 9/2006 | Sohn | 365/154 |
| 7,168,005 B2 | * | 1/2007 | Adams et al. | 714/31 |
| 7,284,159 B2 | | 10/2007 | Chakraborty et al. | |
| 7,335,881 B2 | | 2/2008 | Tanaka et al. | |
| 7,502,976 B2 | * | 3/2009 | Ross et al. | 714/718 |

OTHER PUBLICATIONS

Kinoshita, M.; Yamauchi, T.; Amano, T.; Dosaka, K.; Arimoto, K.; , "Design methodology of the embedded DRAM with the virtual socket architecture," Custom Integrated Circuits Conference, 2000. CICC. Proceedings of the IEEE 2000, vol., No., pp. 271-274, 2000 doi: 10.1109/CICC.2000.852664.*
Hansen, P.; , "Testing conventional logic and memory clusters using boundary scan devices as virtual ATE channels," Test Conference, 1989. Proceedings. Meeting the Tests of Time., International, vol., No., pp. 166-173, Aug. 29-31, 1989 doi: 10.1109/TEST.1989.82291.*

* cited by examiner

*Primary Examiner* — Cynthia Britt
(74) *Attorney, Agent, or Firm* — Meyertons, Hood, Kivlin, Kowert & Goetzel, P.C.; Erik A. Heter (57) ABSTRACT

An integrated circuit. The integrated circuit includes a plurality of logic circuits. The integrated circuit further includes a scan chain including a plurality of scan elements coupled in series, wherein the scan chain is configured to load stimulus data to be applied to the logic circuits for testing. The scan chain is further configured to capture data subsequent to applying the stimulus data. The integrated circuit also includes an embedded memory having a read port, wherein the read port is coupled to one or more of the plurality of logic circuits via a read path. The embedded memory includes a virtual entry having a plurality of scan-controllable storage elements. During testing, the virtual entry is operable to apply transition data to the read path in order to cause logic state transitions in the one or more logic circuits in the read path.

18 Claims, 5 Drawing Sheets

APPARATUS FOR TESTING EMBEDDED MEMORY READ PATHS

BACKGROUND OF THE INVENTION

1. Field of the Invention

This invention relates to testing of electronic circuits, and more particularly, to the testing of integrated circuits having embedded memories.

2. Description of the Related Art

Scan testing is a means of testing the internal logic of large, complex integrated circuits. Test stimulus data is loaded into the integrated circuit via a chain of scannable storage devices (e.g., scan flip flops). A scan chain may be thought of as a long shift register made up of scan devices.

The test stimulus data is then applied by the devices of the scan chain to the internal logic. After allowing time for the logic to respond, result data is captured into devices of the scan chain, after which it may be scanned out for observation and a determination of whether or not the device under test passed.

Many integrated circuits include one or more embedded memories. For example, a microprocessor typically includes at least one cache and at least one register file. Modern microprocessors often include two or levels of cache memory (divided between instructions and data) as well as large register files that allow for the storage of several different register states. These embedded memories are typically not scan testable. Furthermore, embedded memories can often times interfere with test access to certain logic circuits. Because of this, some logic circuits may be untested. Alternatively, a significant amount of extra circuitry may be required to arrange such logic circuits for test access.

SUMMARY OF THE INVENTION

An integrated circuit is disclosed. In one embodiment, the integrated circuit includes a plurality of logic circuits. The integrated circuit further includes a scan chain including a plurality of scan elements coupled in series, wherein the scan chain is configured to load stimulus data to be applied to the logic circuits for testing. The scan chain is further configured to capture data subsequent to applying the stimulus data. The integrated circuit also includes an embedded memory having a read port, wherein the read port is coupled to one or more of the plurality of logic circuits via a read path. The embedded memory includes a virtual entry having a plurality of scan-controllable storage elements. During testing, the virtual entry is operable to apply transition data to the read path in order to cause logic state transitions in the one or more logic circuits in the read path.

A method for causing transitions in a read path of an embedded memory array in an integrated circuit is also disclosed. In one embodiment, the method includes loading initial logic state data into a plurality of scan registers and loading transition data into a virtual entry of the embedded memory array, wherein the virtual entry includes a plurality of scan-controllable elements each coupled to a corresponding one of the plurality of scan registers. Subsequent to loading the transition data and the initial logic state data the method includes propagating the transition data from the virtual entry to the plurality of scan registers. Following the propagation and loading of the transition data into the plurality of scan registers, the method includes, in a first cycle, propagating the transition data from the plurality of scan registers to one or more logic circuits coupled thereto. In a second cycle, the method includes capturing test result data into one or more scan elements of a scan chain, the test result data being a result of propagating the transition data to the one or more logic circuits

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
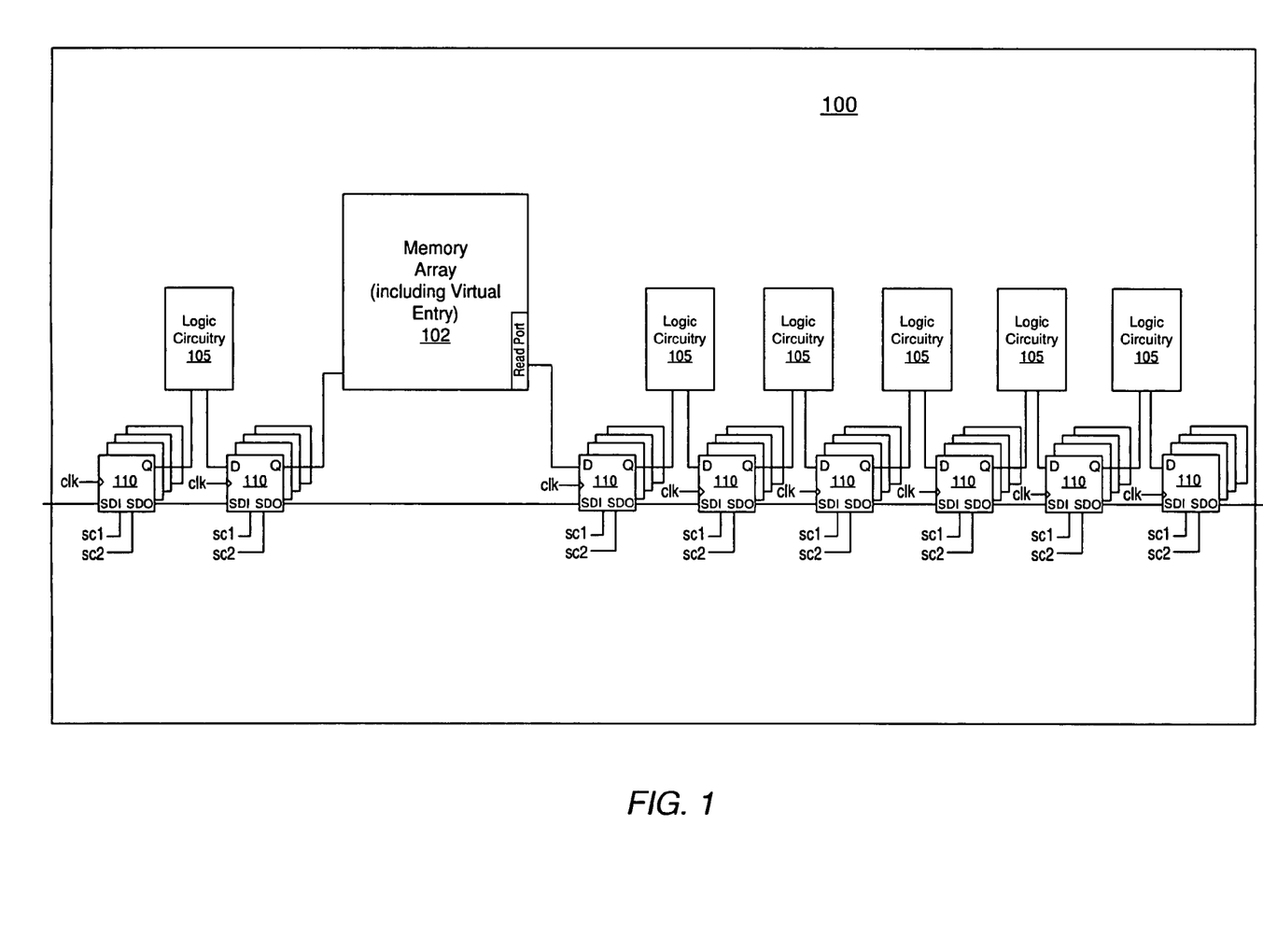
FIG. 1 is a block diagram of an integrated circuit having a scan chain and an embedded memory with a virtual entry.

Turning now to FIG. 1, a block diagram of an integrated circuit having a scan chain and an embedded memory with a virtual entry is shown. In the embodiment shown, integrated circuit 100 includes a plurality of logic circuits 105. A plurality of scan elements 110 are coupled to each other in order to form a scan chain. Integrated circuit 100 may include a plurality of scan chains, although connections for only a single scan chain are shown here for the sake of simplicity.

Scan elements 110 of the scan chain are serially coupled together via a scan data path. The scan data path includes the SDI (scan data in) input and the SDO (scan data out) output of each scan element 110. Essentially, the scan chain formed by the plurality of scan elements 110 forms a serial shift register. Although not explicitly shown here, each scan element 110 may include one or more scan clock inputs that are used to latch data into the element through the SDI input, as well as shifting it through to the SDO output. In the embodiment shown, scan elements 110 are level sensitive scan design (LSSD) scan elements, although other types of scan elements (e.g., multiplexer-D) scan elements may also be used to implement the scan chain. Thus, each of scan elements 110 shown in this particular embodiment is coupled to receive a first and second scan clock signals (sc1 and sc2, respectively), as well as an operational clock signal (clk).

Test stimulus data may be input into integrated circuit 100 by inputting data into the SDI input of the first scan element 110 and shifting it through the chain to the appropriate location. After stimulus data has been loaded into the scan elements, it may be applied to the various logic circuits 105. More particularly, the stimulus data may be provided to each logic circuit 105 via the Q output of the corresponding scan element(s) 110. After allowing sufficient time for the logic circuitry to respond to the stimulus data, test output data indicative of how the logic circuits 105 responded to the stimulus data is captured through the D inputs of the corresponding scan elements 110. Subsequent to its capture in scan elements 110 of the scan chain, the test result data may be shifted from integrated circuit 100 and made available for analysis.

In the embodiment shown, integrated circuit 100 includes a memory array 102, which may be one of several different functional memory types (e.g., cache memory, register memory, RAM, ROM, SRAM, etc.). Typically, memory arrays such as memory array 102 are not testable using scan testing, and are thus tested by other means. However, the fact that these types of memory arrays are not scan testable may still impact the overall testability of integrated circuit 100 by introducing complications in scan testing circuits coupled to a read path (i.e. a path in which data read from the memory is conveyed). The read path originates from a read port of the memory, as shown in the drawing. The ability to determine whether or not at-speed (i.e. operational speed) logical transitions can take place on the signal lines of the read path is one aspect that may be impacted by a memory that is not scan testable. Memory array 102 includes a virtual entry having a plurality of scan controllable elements which in order enable full, at-speed testing of the read path, including its ability to convey logical transitions thereon. For the purposes of this disclosure, at-speed testing can be consider testing at the maximum operational speed of the integrated circuit. For example, if the integrated circuit is rated to operate at a clock speed of 3.0 GHz, the testing described herein may also be conducted at 3.0 GHz.

The virtual entry does not alter the timing of read access of memory array 102 during normal operation. In some prior art embodiments, transition testing may be accomplished by placing a multiplexer in the read path. However, the multiplexer adds delay to the read path, and thus can reduce the maximum speed at which the device can operate. In contrast, the use of the virtual entry adds no delay into the read path, and thus does not limit the operational speed of the device.

Figure 2:
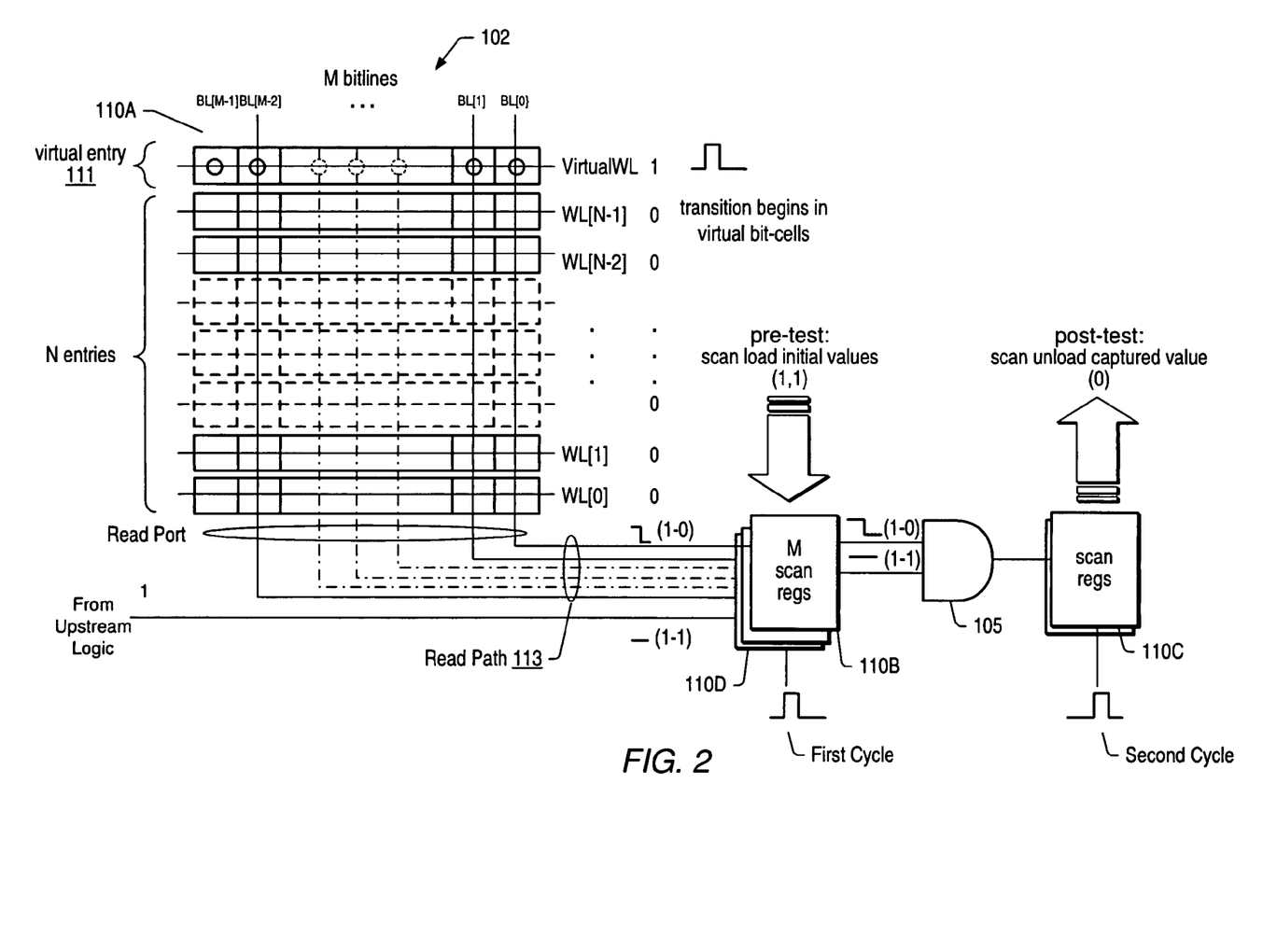
FIG. 2 is a drawing illustrating one embodiment of a memory array having a virtual entry and the launching of transitions from the virtual entry.

FIG. 2 is a drawing illustrating one embodiment of a memory array having a virtual entry and the launching of transitions from the virtual entry. In the embodiment shown, memory array 102 includes N entries of M bits each, as well as a virtual entry 111. Virtual entry 111 is essentially an $(N+1)^{th}$ entry, and includes a plurality of scan registers 110A that may be similar or the same as those shown scan elements 110 shown in FIG. 1. The N entries are those in which data is stored in during normal operation of the integrated circuit in which it is implemented. Each of the N entries includes one of the word lines WL[0] to WL[N-1]. Within each entry are a number of intersections between the corresponding word line the bit lines, BL[M-1] to BL[0]. The M bit lines of memory 102 are coupled to read path 113 upon which data read from the memory is conveyed. Read path 113 may be part of, or may couple to, a data bus upon which data is conveyed. Stimulus data designed to cause transitions of logic coupled downstream relative to the read path may be loaded into each of the bit positions prior to conducting a test. The use of the stimulus data loaded into the bit positions of virtual entry 111 prior to test will be discussed in further detail below.

In the embodiment shown, the M bit lines are coupled to M scan registers 110B, which may be similar to or the same as scan elements 110 of FIG. 1. Furthermore, the M scan registers 110B may, in one embodiment, be part of the scan chain shown in FIG. 1, although in other embodiments, may be part of a separate scan chain. Prior to a test where transitions are to be launched in order to determine whether logic transitions can be conveyed in the read path, initial state data may be loaded into scan registers 110B. Additional scan registers coupled to receive data from upstream logic may also be present. In the example shown, a signal line from upstream logic is coupled to a scan register 110D, which is in turn has an output coupled to logic circuits 105.

The M scan registers 110B are coupled to provide the stimulus data to logic circuits 105 coupled thereto. In the example of FIG. 2, the logic circuits are, for the sake of simplicity, represented by a single AND gate. It should be understood that the additional logic gates of varying types (e.g., OR, NAND, NOR, XOR, etc.) may also be included in the logic circuits 105, and sequential logic circuits may also be present. The output(s) of logic circuits 105 may be coupled to M scan registers 110C, which may also be similar to or the same as scan elements 110 of FIG. 1, and further, may be part of the same scan chain. Alternatively, the M scan registers may be part of a different scan chain, and/or of a different type. In one embodiment, each of the scan registers 110A of the virtual entry, scan register 110B, 110C, and 110D, may all be associated with the same scan chain(s), thereby allowing all test data to be loaded within a single scan load. Providing the ability to load the test data in a single scan load may significantly reduce the required test time.

Initial state data from the M scan registers 110B can be applied to the logic circuits 105 in order to determine an initial response. The response of logic circuits 105 may be captured by the M scan registers 110C, where they may be stored until the transitions are launched. The response to the initial state may also be shifted out for analysis, which may include a determination of whether the logic circuits responded as expected to the initial stimulus values.

After logic circuits 105 have been allowed sufficient time to respond to the initial values (as well as sufficient time to enable the results to be captured by the M scan registers 110C), the transitions may be launched. This portion of the test may be accomplished by first asserting a signal on the word line of the virtual entry (VirtualWL). By asserting the word line, the data stored in each of the M scan registers 110A of the virtual word line becomes operatively coupled to its corresponding bit line. Thus, the transition data initially stored in the virtual entry is conveyed along the bit lines and through read path 113 to corresponding scan registers 110B.

After the transition data has been latched into scan registers 110B and the data from upstream logic has been latched into registers 110D, a first cycle of the actual test commences by propagating this data to logic circuits 105. The data is propagated to the logic circuits 105 by a first toggling of the operational clock signal received by each of scan registers 110B. For purpose of illustrating the propagating of a transition, an AND gate representing logic circuits 105 is used for the sake of example. The initial data applied to the inputs of the AND gate were both logic 1's—a first logic 1 from upstream logic, and a second logic 1 from one of the M scan registers 110B, which was loaded as initial state data. As shown in the drawing, the data being propagated along read path 113 from BL[0] is a logic 0, thereby indicating a transition from a logic 1 to a logic 0. This logic 0 is then captured, by a corresponding one of the M scan registers 110B. Thus, when the first cycle of the test for transitions begins, a logic 0 and a logic 1 are applied to the inputs of the AND gate. Accordingly, if the AND gate is functioning correctly, it will respond to these new inputs by generating a logic 0 as an output, whereas the previous inputs (both logic 1's) had generated a logic 1 as an output. Therefore, if the AND gate is functioning correctly, applying the initial inputs followed by the inputs that include the transition launched from virtual entry 111 will result in a change of the output from a logic 1 to a logic 0.

After logic circuits 105 (including the AND gate) have had sufficient time to respond to the new inputs, the output of these logic circuits may be captured by scan registers 110C in a second cycle. In the example shown, one of the scan registers 110C is coupled to the output of the AND gate. The output data of the AND gate may be captured by this particular scan register 110C responsive to a second toggling of the operational clock signal, while similar scan registers 110C may capture output data of other logic circuits. After the capture of the data, it may be shifted out through a scan chain of which scan registers 110C may be a part in order to determine whether or not the transitions occurred as expected.

As logic circuits 105 may include a number of gates having inputs from one of the M scan registers 110B, similar transitions may be launched from other bit positions in virtual word line 111. Furthermore, multiple tests may be run to ensure that logical transitions from a logic 0 to logic 1 as well as a logic 1 to logic 0 occur. The ability to launch transitions may be particularly useful in finding certain faults such as resistive shorts and resistive opens that might temporarily mask or delay a transition. Such resistive shorts/opens may cause the rise time or fall time of a transition to be slower than is necessary to maintain operational speed of the device.

Figure 3:
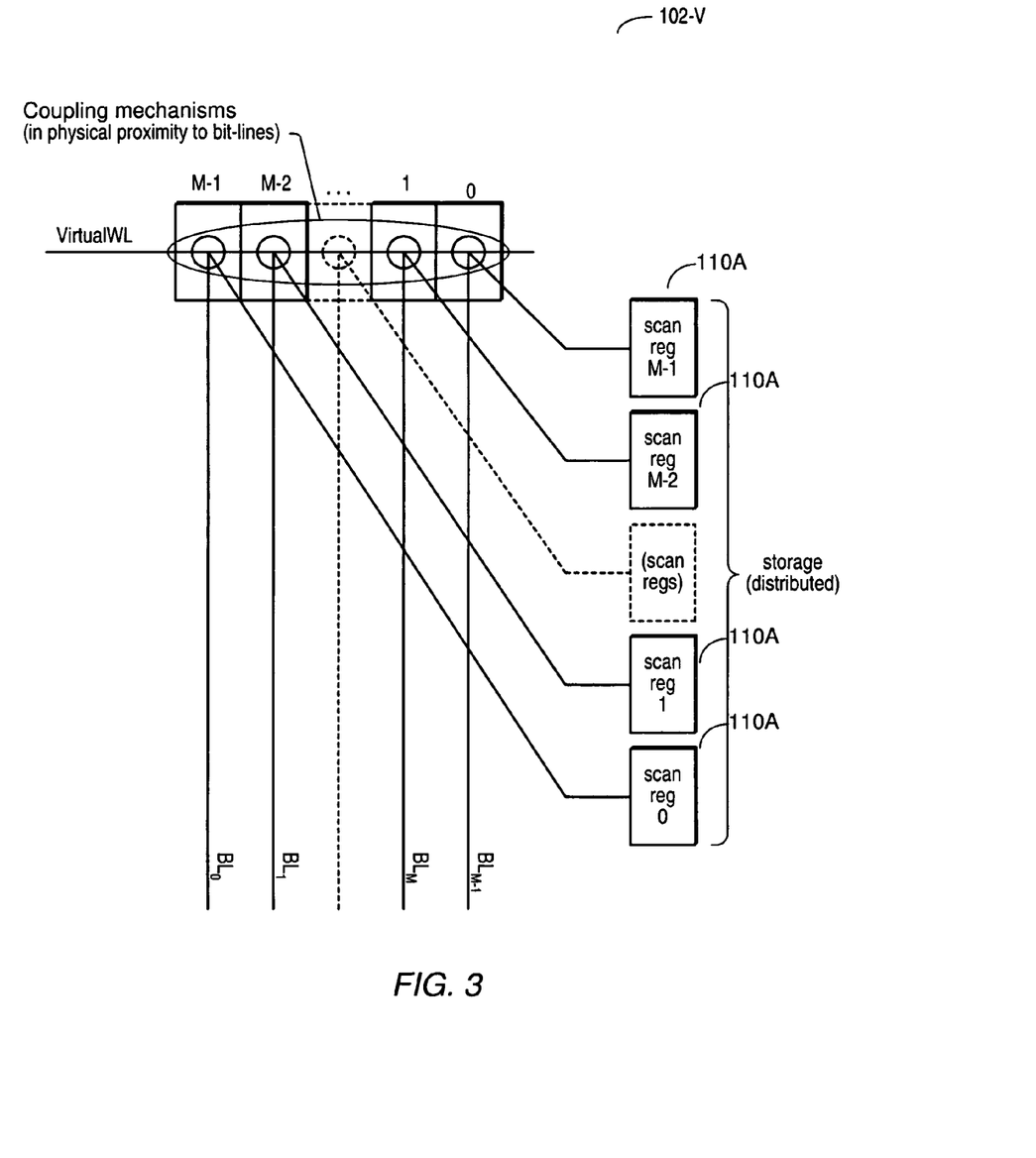
FIG. 3 is a block diagram of one embodiment illustrating an arrangement of scan-controllable storage elements of a virtual entry relative to the bit lines of the embedded memory array.

FIG. 3 is a block diagram of one embodiment illustrating an arrangement of scan-controllable storage elements of a virtual entry relative to the bit lines of the embedded memory array. In the embodiment shown, virtual entry 102-V includes a plurality of scan registers 110A. The scan registers 110A are scan-controllable storage elements, with one present and corresponding for each of the bit positions of the memory array. The scan controllable storage elements may be the same as scan elements 110 shown in FIG. 1, or may be any other type of scan element that is known in the art of scan testing.

Each of scan registers 110A is operatively coupled to the bit line of its corresponding bit position. Furthermore, each scan register 110A is coupled to the virtual word line (VirtualWL) associated with virtual entry. When a signal is asserted on the virtual word line, the contents of scan registers 110A are enabled to propagate onto their associated bit lines, and thus may launch transitions as described above. The actual coupling of scan registers 110A to the bit lines is illustrated in FIG. 4.

Figure 4:
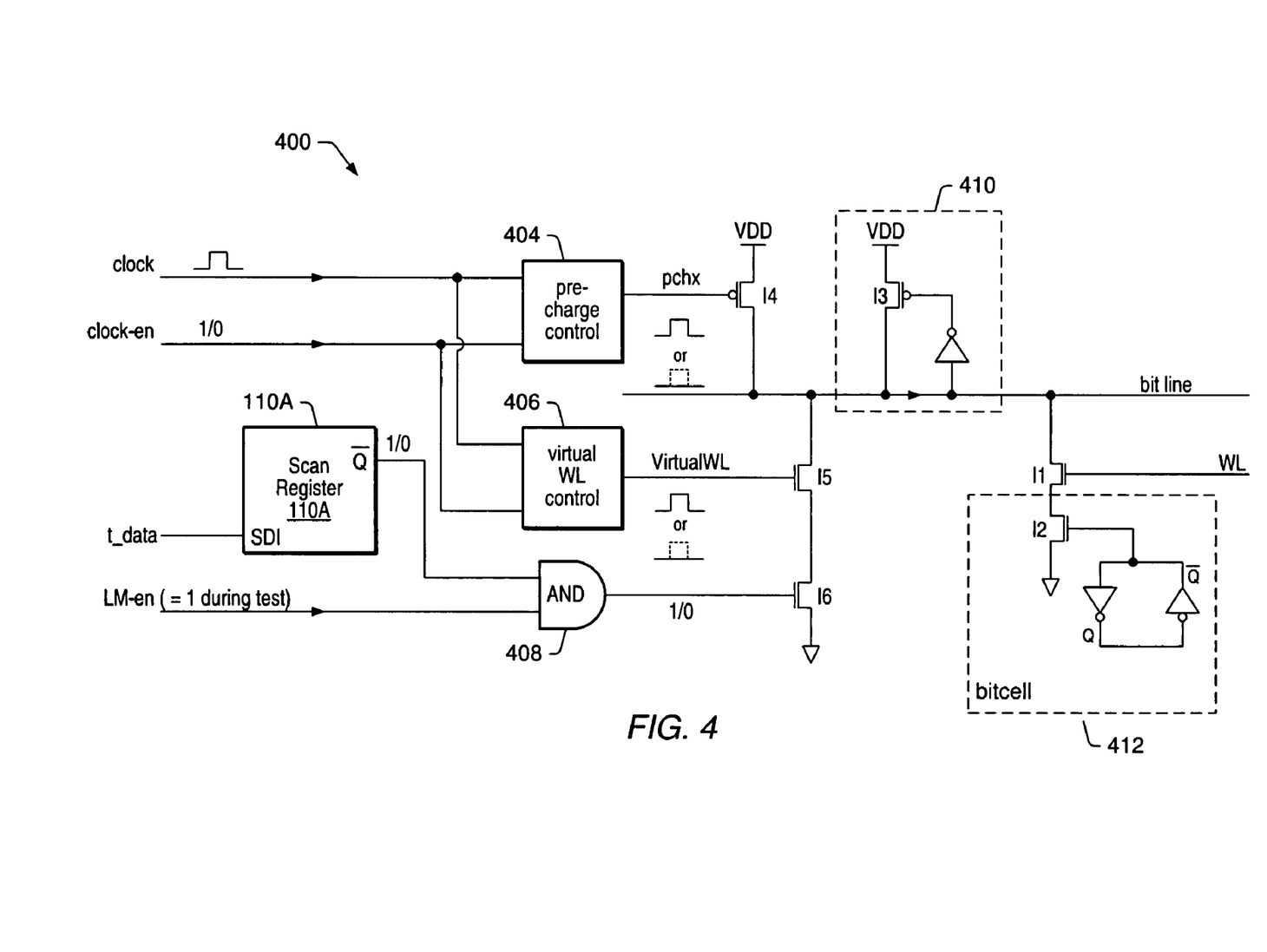
FIG. 4 is a schematic diagram illustrating one embodiment of a circuit that couples a scan-controllable element of a virtual entry to a bit line of an embedded memory array.

FIG. 4 is a schematic diagram illustrating one embodiment of a circuit that couples a scan-controllable element of a virtual entry to a bit line of an embedded memory array. Circuit 400 is configured to enable either data from a scan element of the virtual entry or data from a bit cell to be propagated on the bit line. Scan register 110A is a scan controllable storage element that is configured to store transition data for the bit position corresponding to the bit line. Transition data may be loaded into scan register 110A through the SDI input via the signal line labeled t_data.

During normal (i.e. non-test) operations, data is stored in bit cells such as bit cell 412. As shown in FIG. 2, the memory array of which bit cell 412 is a part includes N entries, and thus there are N bit cells coupled to the bit line (only one is shown here for the sake of simplicity). When a positive voltage signal is asserted on word line (WL) coupled to bit cell 412, transistor I1 is turned on, thereby allowing the data stored in the cell to propagate to the bit line. However, during test operations, transistor I1 is held in off state by keeping a voltage on word line WL that prevents it from turning on.

During test operations, an enable signal (LM-en) is asserted. In this particular embodiment, the complementary output of scan register 110A is coupled to an input of AND gate 408, along with the LM-en signal line. Thus, during test mode, the output of AND gate 408 is asserted according to the data stored in scan registers 110A. If scan register 110A is storing a logic 1, its complement causes the output of AND gate 408 to be a logic 0, and thus transistor I6 remains off. If scan register 110A is storing a logic 0 during test mode, the output of AND gate 408 is turned on, and thus transistor I6 is also turned on.

The virtual word line VirtualWL and the complementary pre-charge line (pchx) may be activated or de-activated according to the clock and the clock enable (clock-en) inputs. A precharge operation may occur if either the clock signal is low or the clock enable signal, clock-en is low. During operations when the clock is enabled, the clock-en signal is a logic 1. Thus, precharging of the bit line may occur any time the clock signal is low, which results in logic 0 (or logic low) on the pchx output of precharge control circuit 404. This in turn results in the turning on of the PMOS transistor I4, thereby allowing the bit line to be pulled up toward the voltage VDD. When the clock signal transitions to a high state, transistor I4 is turned off, and the bit line can be pulled in accordance with that data stored in bit cell 412 (during normal operations) or the data stored in scan register 110A (during test operations).

A signal on VirtualWL is asserted when both clock-en is asserted and the clock signal is high. Assertion of a signal on VirtualWL in turn may cause transistor I5 to turn on. If transistor I6 is turned on when transistor I5 is turned on, the bit line is pulled down to ground. Thus the logic 0 stored in scan register 110A (that resulted in I6 turning on via AND gate 408) is in effect conveyed to the bit line.

If a logic 1 is stored in scan register 110A, the complementary output will be a logic 0, and thus that output of the AND gate will also be a logic 0. In this case, I6 will not be turned on. Thus, even if I5 is turned on, the voltage on the bit line will not be pulled down to ground. Since the bit line is precharged when the clock is low, a logic 1 will thus remain present on bit line when a logic 1 is present on VirtualWL and transistor I6 is turned off. Thus, in this case, a logic 1 stored in scan register 110A is in effect conveyed to the bit line.

Keeper 410 is a weak keeper circuit configured to hold a logic 1 on the bit line when precharge operations are not in progress. Transistors I5 and I6 are configured to have a stronger pull than transistor I3 of keeper 410. Thus, transistors I5 and I6 are configured to, when activated, override transistor I3 of keeper 410 in order to pull the bit line to a logic low state.

It should be noted that circuit 400 is exemplary. Other embodiments of circuits that couple scan registers of a virtual entry to bit lines of a memory array are possible and contemplated.

Figure 5:
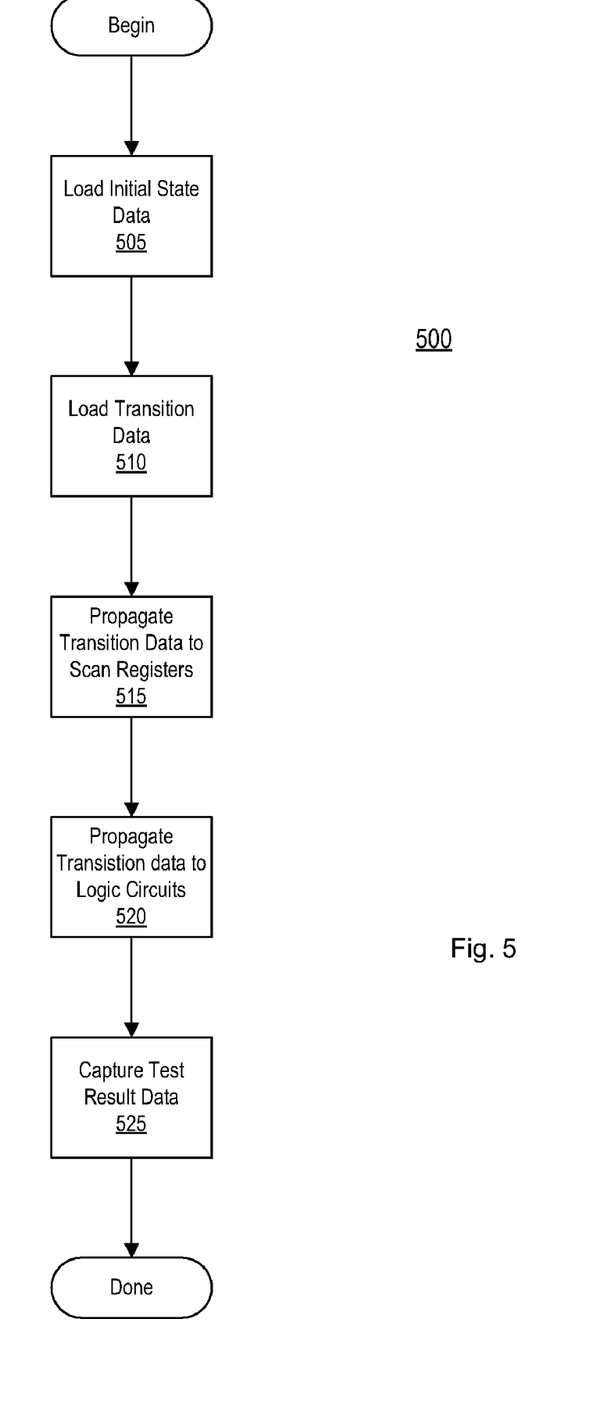
FIG. 5 is a flow diagram illustrating one embodiment of a method for launching transitions into the read path of a memory array from a virtual entry.

Turning now to FIG. 5, a flow diagram illustrating one embodiment of a method for launching transitions into the read path of a memory array from a virtual entry is shown. The method described herein may be utilized with various embodiments of the integrated circuits and various components thereof discussed in reference to FIGS. 1-4.

In the embodiment shown, method 500 begins with the loading of initial state data into a plurality of scan registers in the read path of an embedded memory array in an integrated circuit (505). The scan registers are scan controllable storage elements, and may be part of a scan chain. The method further includes loading transition data into a plurality of scan controllable storage elements that make up a virtual entry of the embedded memory array (510). The scan controllable storage elements of the virtual entry may also be part of a scan chain. In some embodiments, the scan chain may be the same one as that of the scan registers that received the initial state data. In other embodiments, the scan controllable storage elements may be in a different scan chain from the scan registers that received the initial state data. In some embodiments of method 500, the loading of initial state data and transition data may be performed concurrently rather than sequentially.

After both initial state data and transition data have been loaded, transitions are launched by first propagating transition data to the scan registers (515). This may be performed concurrently with initial state data being propagated to logic circuits coupled to the outputs of the scan registers. After allowing sufficient time for the logic circuits to respond to the initial state data, the transition data is then propagated to the logic circuits (520). Depending on the initial state data and the transition data, as well as the integrity of the logic circuits and the connections therebetween, transitions may occur on outputs of the logic circuits. After allowing sufficient time for the logic circuits to respond, a capture operation is performed in order to capture the output states of the logic circuits (i.e. test result data) after transition data has been applied (525). In various embodiments, two capture operations may be performed. The first of these occurs after the initial states have been applied, with the second being performed after transition data has been applied. Shift operations to shift the captured test result data out of the integrated circuit may occur after each of the capture operations. This allows comparison of the responses of the logic circuits to the initial state data and the transition data, and is thus used to verify whether or not the intended transitions occurred at or above the rated speed of the circuit.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
   a plurality of logic circuits;
   a scan chain including a plurality of scan elements coupled in series, wherein the scan chain is configured to load stimulus data to be applied to the logic circuits for testing, and is further configured to capture data subsequent to applying the stimulus data; and
   an embedded memory having a read port, wherein the read port is coupled to one or more of the plurality of logic circuits via a read path, wherein the memory array includes (N+1) rows each configured to store M bits, wherein in N and M are each positive integers greater than one;
   wherein the embedded memory includes a virtual entry, wherein the virtual entry is an $(N+1)^{th}$ row of the embedded memory, the virtual entry having M scan-controllable storage elements, wherein, during testing, the virtual entry is operable to apply transition data to the read path in order to cause logic state transitions in the one or more logic circuits in the read path.

2. The integrated circuit as recited in claim 1, wherein the embedded memory includes a N+1 word lines and a M bit lines, wherein each of the M scan-controllable storage elements of the virtual entry is coupled to a common one of the N+1 word lines, and wherein each of the M scan-controllable storage elements is operatively coupled to a corresponding one of the M bit lines, and wherein the M bit lines are coupled to the read path.

3. The integrated circuit as recited in claim 2, wherein the read path further includes M scan registers coupled between corresponding ones of the M scan-controllable storage elements and one or more of the plurality of logic circuits, wherein each of the M scan registers is configured to store a bit of initial state data.

4. The integrated circuit as recited in claim 3, wherein each of the M scan registers includes an input that is coupled to an output of the corresponding one of the M scan-controllable storage elements of the virtual entry via a corresponding bit line.

5. The integrated circuit as recited in claim 3, wherein each of the plurality of scan elements, each of the M scan-controllable storage elements, and each of the M scan registers is coupled to receive a first scan clock signal and a second scan clock signal, and is further configured to receive an operational clock signal.

6. The integrated circuit as recited in claim 3, wherein during a first operational clock cycle, each of the M scan registers is configured to propagate transition data received from corresponding ones of the M scan-controllable storage elements of the virtual entry.

7. The integrated circuit as recited in claim 6, wherein, during a second operational clock cycle, one or more scan elements of the scan chain are configured to capture data resulting from the propagation of transition data produced by logic circuits that received the transition data.

8. The integrated circuit as recited in claim 2, wherein the M scan controllable storage elements of the virtual entry are configured to apply transition data to corresponding ones of the M bit lines responsive to assertion of a signal on a word line word line coupled to the virtual entry.

9. The integrated circuit as recited in claim 1, wherein each of the scan elements of the scan chain and each of the scan registers are level sensitive scan devices.

10. A method comprising:
    loading initial logic state data into each of M scan registers;
    loading transition data into a virtual entry of the embedded memory array having (N+1) rows each configured to store M bits, wherein the virtual entry is an $(N+1)^{th}$ row of the embedded memory array, wherein N and M are integer values greater than one, and wherein the virtual entry includes M of scan-controllable storage elements each coupled to a corresponding one of the M scan registers;
    propagating the transition data from the virtual entry to the M scan registers;
    in a first cycle, propagating the transition data from the M scan registers to one or more logic circuits coupled thereto; and
    in a second cycle, capturing test result data into one or more scan elements of a scan chain, the test result data being a result of propagating the transition data to the one or more logic circuits.

11. The method as recited in claim 10, wherein said propagating the transition data from the virtual entry includes selecting a word line associated with the virtual entry, the word line being one of a plurality of word lines of the embedded memory; and
    wherein said propagating the transition data from the virtual entry includes an output of each of the M scan-controllable storage elements providing transition data onto a corresponding one of M bit lines of the embedded memory.

12. The method as recited in claim 11, wherein each of the M scan registers is coupled to receive transition data from a corresponding one of the M scan controllable storage elements via a corresponding one of the M bit lines.

13. The method as recited in claim 12, wherein each of the M scan registers includes a first input coupled to receive a corresponding bit of the initial state data and a second input coupled to a corresponding one of the plurality of bit lines.

14. The method as recited in claim 12, wherein each of the plurality of scan elements, each of the M scan-controllable storage elements, and each of the M scan registers is coupled to receive a first scan clock signal and a second scan clock signal, and is further configured to receive an operational clock signal.

15. The method as recited in claim 12, wherein during a first operational clock cycle of a test, each of the M scan registers is configured to propagate transition data received from corresponding ones of the M scan-controllable storage elements of the virtual entry.

16. The method as recited in claim 15, wherein, during a second operational clock cycle of the test, one or more scan elements of the scan chain are configured to capture data resulting from the propagation of transition data produced by logic circuits that received the transition data.

17. The method as recited in claim 11, further comprising the M scan controllable storage elements of the virtual entry applying transition data to corresponding ones of the M bit lines responsive to assertion of a signal a word line coupled to the virtual entry.

18. The method as recited in claim 10, wherein each of the scan elements of the scan chain and each of the scan registers are level sensitive scan devices.

* * * * *